United States Patent
Riseman

[11] 3,972,754
[45] Aug. 3, 1976

[54] METHOD FOR FORMING DIELECTRIC ISOLATION IN INTEGRATED CIRCUITS

[75] Inventor: Jacob Riseman, Poughkeepsie, N.Y.

[73] Assignee: IBM Corporation, Armonk, N.Y.

[22] Filed: May 30, 1975

[21] Appl. No.: 582,336

[52] U.S. Cl. ................................ 148/175; 29/578; 29/580; 148/174; 148/187; 357/40; 357/50; 357/59

[51] Int. Cl.$^2$ .................. H01L 21/76; H01L 27/04; H01L 21/22

[58] Field of Search .................... 148/174, 175, 187; 29/578, 580; 357/40, 50, 59

[56] References Cited
UNITED STATES PATENTS

| | | | |
|---|---|---|---|
| 3,379,584 | 4/1968 | Bean et al. | 148/175 |
| 3,386,865 | 6/1968 | Doo | 148/175 |
| 3,481,801 | 12/1969 | Hugel | 148/175 |
| 3,648,125 | 3/1972 | Peltzer | 357/50 |
| 3,796,613 | 3/1974 | Magdo et al. | 148/175 |
| 3,861,968 | 1/1975 | Magdo et al. | 148/175 |

*Primary Examiner*—L. Dewayne Rutledge
*Assistant Examiner*—W. G. Saba
*Attorney, Agent, or Firm*—J. B. Kraft

[57] ABSTRACT

In the fabrication of integrated circuits, a method is provided for forming dielectrically isolated regions in the silicon substrate comprising selectively etching recesses in a silicon substrate and thermally oxidizing the recessed portions of the silicon substrate to form regions of recessed silicon dioxide extending into the substrate. Then, a blanket introduction of impurities of opposite-type conductivity is made into the portions of the substrate remaining unoxidized, after which a layer of silicon of said opposite-type conductivity is epitaxially deposited on the substrate surface. Next, utilizing appropriate silicon nitride masking, recesses are etched into the silicon epitaxial layer in registration with the now buried regions of recessed silicon dioxide in the substrate. Then, the recessed portions of the silicon epitaxial layer are thermally oxidized to the extent sufficient to form regions of recessed silicon dioxide extending through said epitaxial layer into registered contact respectively with the regions of recessed silicon dioxide formed in the substrate.

6 Claims, 13 Drawing Figures

3,972,754

METHOD FOR FORMING DIELECTRIC ISOLATION IN INTEGRATED CIRCUITS

BACKGROUND OF INVENTION

With the ever increasing microminiaturization of semi-conductor integrated circuits, and, thus, increasing lateral semiconductor device densities in the integrated circuit, in recent years a major portion of the integrated circuit art has been moving in the direction of utilizing lateral dielectric isolation in order to laterally electrically isolate the densely packed devices from each other.

One approach for forming lateral dielectric isolation which has been increasingly utilized in the art involves the formation of recessed silicon dioxide lateral isolation regions, usually in the epitaxial layer where the semiconductor devices are to be formed, through the expedient of first selectively etching a pattern of recesses in the layer of silicon, and then thermally oxidizing the silicon in the recesses with appropriate oxidation blocking masks, e.g., silicon nitride masks, to form recessed or inset regions of silicon dioxide which provide the lateral electrical isolation. Representative of the prior art teaching in this area are U.S. Pat. No. 3,648,125 and an article entitled, "Locos Devices", E. Kooi et al, Philips Research Report 26, pp. 166 – 180 (1971). While this approach has provided good lateral electrical isolation, it had its limitations. The etched recesses generally were widest at the surface and tended to taper more narrowly, with increasing depth from the surface. Thus, such dielectric isolation had its limits with respect to depth, i.e, the deeper the isolation was to extend, the wider the recess had to be, thereby consuming the valuable lateral "real estate". As a result, relatively deep recessed silicon dioxide structures would tend to offset the very reason for selecting dielectric isolation over lateral junction isolation, that of narrower lateral device dimensions and, consequently, greater lateral device densities.

One major prior art expedient for limiting the depth to which recessed silicon dioxide lateral isolation need to be formed involves the combination of recessed silicon dioxide at the surface of the silicon layer with a junction isolation, e.g., p–type isolation region, below the recessed oxide. Such hybrid structures are described in the prior art, for example, in U.S. Pat. No. 3,858,231 or in the previously mentioned article from the Philips Research Report. The P+ isolation region beneath the recessed oxide may be formed either by out-diffusion from a buried P+ region in the silicon substrate below the silicon epitaxial layer or by a P+ diffusion into the etched recess prior to the thermal oxidation to form the silicon dioxide inset.

FIG. 1 of the drawings shows a typical prior art structure of this type. N– epitaxial region 10 is formed on P– substrate 11. The device regions 12 in the substrate are electrically isolated by enclosures comprising silicon dioxide regions 13 and P+ isolation regions 14. The devices consist of emitter 15, base 16, buried subcollector 17, respective metal contacts 18, 19 and 20 to each, and passivation layer 21.

Recently, the art of etching recesses in silicon has developed processes for etching substantially vertical-walled recesses in silicon. Typical of these new etching techniques is described in the article entitled, "The Etching Of Deep Vertical-Walled Patterns In Silicon", A. I. Stoller, R.C.A. Review, June 1970, pp. 271 – 275.

With such new vertical-walled etching techniques, it has now become possible to substantially narrow the lateral dimensions of recessed silicon dioxide regions. However, with the narrowing of the lateral dimensions of such recessed silicon dioxide regions, further problems have been presented to the art, particularly where such recessed silicon dioxide regions have been used to provide isolation to bipolar integrated circuits.

With reference to FIG. 2, one potential problem encountered by the utilization of deep vertical-walled recessed oxide extending through the epitaxial layer will be illustrated. The interface between P– substrate 22 and epitaxial layer 23 is phantom line 24. Thus, recessed silicon dioxide regions 25 extend beyond the interface into the substrate 22. However, because of the narrowed lateral dimensions in each transistor device, buried subcollector 26 must abut the lower portions of substantially vertical-walled silicon regions 25. This is necessary because emitter region 27 abuts the vertical-walled silicon dioxide region 25, and the buried subcollector region 26 must be disposed below all portions of the emitter 27 in order for the transistor to function properly. Since the buried subcollector is driven both vertically and laterally into the substrate during the high temperature thermal oxidation necessary to produce recessed silicon dioxide regions 25, as well as during all subsequent high heat diffusion and oxidation cycles in the transistor formation, there is a strong tendency for adjacent subcollector regions such as regions 26 and 26' to laterally diffuse and meet each other beneath recessed silicon dioxide regions 25 as shown at point 28 of the drawing.

This problem is difficult to avoid since in the formation of the integrated circuit the buried subcollector 26 must initially be placed sufficiently close to that portion of the substrate to which the recessed silicon dioxide region 25 is to extend. Otherwise, there is a distinct danger that the buried subcollector will not extend beneath those portions of emitter 27 which abut recessed silicon dioxide region 25. It should be noted that even where the buried subcollector 26 is a relatively shallow region and an attempt is made to drive recessed silicon dioxide region 25 as deep into substrate 22 as possible, the problem of adjacent buried subcollectors shorting into each other is still pronounced since even as the recessed oxide region 25 is driven deep into the substrate, the N–type impurities from subcollector region 26 will be driven down ahead of silicon dioxide region 25 in a "snow-plough" as described in the above mentioned Philips Research Report article, particularly at page 167. This is especially the case with the P– substrate and an N+ buried subcollector because of the tendency of inversion to readily occur in P– substrates.

In addition, as will be illustrated with respect to FIG. 3, even where the vertical-walled recessed silicon dioxide regions 30 are used in a hybrid structure similar to that of FIG. 1 in combination with buried P+ isolation regions 31, the narrowed device lateral dimensions present a similar problem. Again, since buried subcollector 32 must extend below all of emitter region 33 which abuts the recessed silicon dioxide region 30, there is a resulting P+/N+ junction 33 which, of course, causes the breakdown voltages of the PN-junction isolation to be undesirably low.

SUMMARY OF THE PRESENT INVENTION

Accordingly, it is an object of the present invention to provide a method of integrated circuit fabrication which utilizes recessed silicon dioxide regions for dielectric isolation wherein lateral device dimensions are decreased and lateral device densities thus increased.

It is another object of the present invention to provide a method for integrated circuit fabrication utilizing recessed silicon dioxide dielectric isolation wherein lateral device dimensions are decreased without increased risk of short circuits between adjacent buried regions, particularly adjacent buried subcollectors.

It is a further object of the present invention to provide a method for integrated circuit fabrication utilizing recessed silicon dioxide dielectric isolation wherein lateral device dimensions are decreased and lateral device densities thus increased without reducing the device breakdown voltages.

It is yet another object of the present invention to provide a method for integrated circuit fabrication using recessed silicon dioxide dielectic isolation wherein dielectric isolation of adjacent buried regions, particularly buried subcollectors, is assured.

It is yet a further object of the present invention to provide an integrated circuit structure having a plurality of adjacent buried regions dielectrically isolated from each other.

In accordance with the method of the present invention, there is provided a method for forming dielectrically isolated regions in a silicon substrate which comprises first forming over a silicon substrate surface of one-type conductivity, a first mask comprising silicon nitride having a plurality of openings therethrough, and etching to recess the silicon substrate exposed in the plurality of openings. Then, the exposed recessed portions of the silicon substrate are thermally oxidized to form regions of recessed silicon dioxide extending into the substrate. Next, the mask is removed to expose the silicon substrate, and a blanket introduction of impurities of opposite-type conductivity is carried out into the portions of the substrate surface remaining unoxidized.

Then, a layer of opposite-type conductivity is epitaxially deposited on the substrate surface, and the second mask comprising silicon nitride is formed over the epitaxial layer. This mask has a plurality of openings therethrough in registration with the plurality of openings in the first mask. Then, the portions of the silicon epitaxial layer exposed in said plurality of openings in the second mask is etched to recess such areas, and the areas are then thermally oxidized to an extent sufficient to form regions of recessed oxide extending through the epitaxial layer into registered contact respectively with said regions of recessed silicon dioxide formed in the substrate.

With this method, it is possible to recess the regions of silicon dioxide initially formed in the substrate to a sufficient depth that the buried regions, e.g., buried subcollectors, subsequently introduced during the blanket introduction of impurities do not extend to a point beyond the depth of the recessed silicon dioxide regions. This, of course, becomes practical because in the method of the present invention the initial point of formation of the recessed silicon dioxide regions is the substrate epitaxial layer interface rather the upper surface of the epitaxial layer. The foregoing and other objects, features and advantages of the invention will be apparent from the following more particular description of the preferred embodiments of the invention, as illustrated in the accompanying drawings.

PREFERRED EMBODIMENTS OF THE PRESENT INVENTION

FIGS. 4A – 4H' illustrate the preferred embodiment of the present invention. On a suitable wafer 40, P—, having a resistivity of 10 ohm-cm a composite mask comprising a silicon dioxide lower layer 41 and silicon nitride upper layer 42 is formed in the conventional manner known in the recessed silicon dioxide art. With respect to the particular steps involved in the formation of recessed silicon dioxide, U.S. Pat. No. 3,858,231 may be referred to if any greater detail is required with respect to any particular step. Silicon dioxide layer 41 is thermally grown to a thickness of about 1000 A in the conventional manner. Next, a silicon nitride layer 42 is formed by any conventional technique such as the chemical vapor deposition reaction of silane and ammonia. Alternatively, silicon nitride layer 42 may be deposited by conventional RF sputter deposition techniques. Then, utilizing conventional photolithographic etching techniques. openings 43 are etched through both layers. One conventional technique for etching openings through the silicon nitride layer involves forming by standard photoresist methods, a deposited silicon dioxide mask (not shown) over the silicon nitride layer 42, defining openings in that layer, and etching with a suitable etchant for silicon nitride such as hot phosphoric acid or hot phosphoric salt. The silicon dioxide mask (not shown) is then removed and the remaining silicon nitride serves as a mask for the subsequent formation of openings through silicon dioxide layer 41 coincident with the openings through silicon nitride layer 42. A suitable etchant for the silicon dioxide is buffered hydrofluoric acid.

Figure 1:
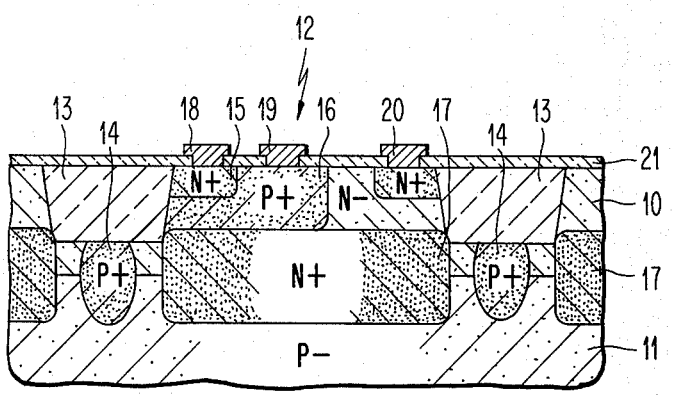
FIGS. 1 – 3 are diagrammatic sectional views of a portion of an integrated circuit in order to illustrate some of the prior art problems associated with recessed silicon dioxide dielectric isolation.
Figure 2:
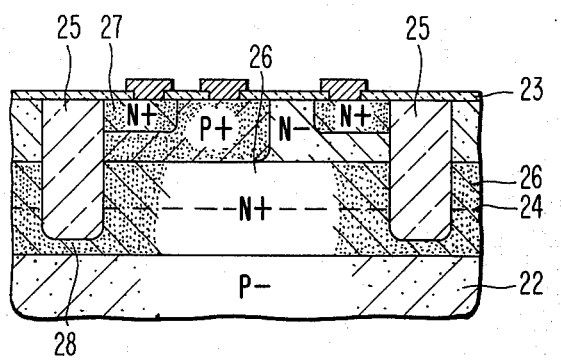
Figure 3:
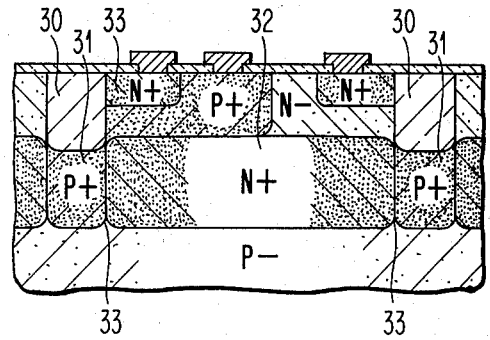

Next, utilizing the composite of layers 41 and 42 as a mask, P— substrate 40 is etched to provide recesses 44, FIG. 2.

It should be noted that these recesses may be formed utilizing a conventionl etchant for silicon such as a composition of nitric acid and diluted hydrofluoric acid in which case they will have the conventional sloped or tapered shape of recesses etched in silicon. Alternatively, they may be formed by a technique of vertical-walled etching as described in the aforementioned R.C.A. Review article, June 1970, particularly at pages 272 – 275, wherein the substrate 40 should have a (110) surface orientation and the etchant utilized would be a boiling mixture of 100 grams KOH in 100 cc of water in which case recesses 44 will have the substantially vertical-walled structure shown in FIG. 4B. The recesses 44 are approximately 1.5 microns in depth. The structure is then put through an oxidation cycle wherein it is placed in an oxidation atmosphere at an elevated temperature, in the order of 973° – 1100° C with addition of water to produce silicon dioxide recessed regions 45 as shown in FIG. 4C. The oxidation is continued until regions 45 extend into substrate 40 for a distance in the order of 3 microns from the surface.

Figure 4A:
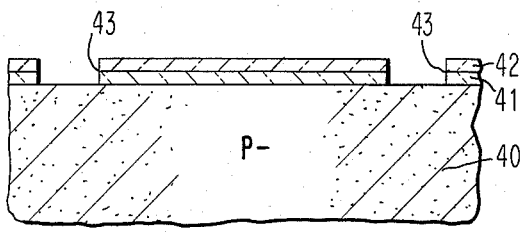
FIGS. 4A – 4H' are diagrammatic sectional views of an integrated circuit in order to illustrate the method of the preferred embodiments of the present invention.
Figure 4B:
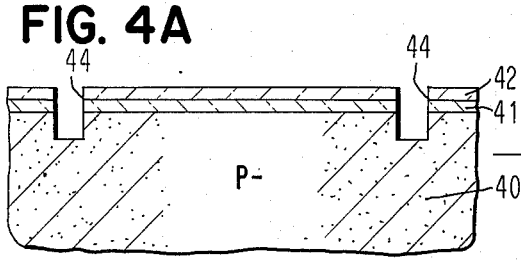
Figure 4B:
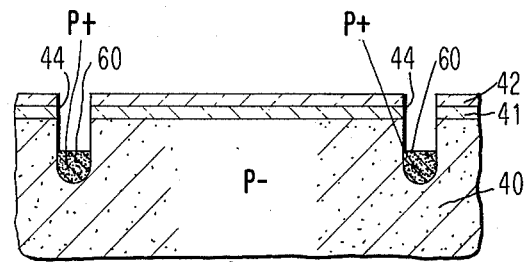
Figure 4C:
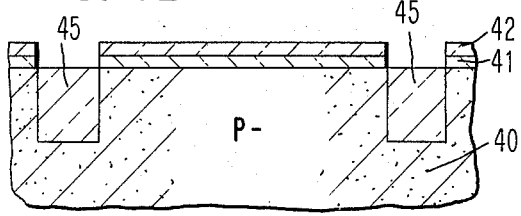
Figure 4D:
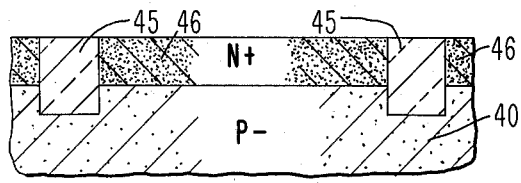

Then, composite masking structure 41 and 42 is removed from the surface of substrate 40 in the conventional manner, and blanket introduction of impurities across the surface is carried out to form what will be buried N+ subcollector regions 46 as shown in FIG. 4D. The blanket introduction of impurities for form N+ regions 46 may be carried out by conventional thermal diffusion of impurities such as phosphorus, arsenic, antimony or the like to a surface concentration of $10^{21}$ atoms/cm$^3$. Alternately, N+ regions 46 may be formed utilizing conventional ion implantation techniques for the introduction of N—type impurities.

It should be noted that the structure being shown and described is only a small portion of an integrated circuit and it is intended to illustrate how the present invention is operable to fabricate recessed silicon dioxide dielectrically isolating structures.

Now, with reference to FIG. 4D it will be understood that during the blanket introduction of impurities to form regions 46, recessed silicon dioxide regions 45 serve the function of defining the surface regions in which the subcollectors 46 are to be formed as well as the subsequent circuit function of dielectrically isolating buried regions 46. For best results, the concentration of impurities in regions 46 as well as the depth of region 46 should be selected so that during subsequent high heat steps such epitaxial growth, thermal oxidation, and the introduction of impurities, region 46 is not driven into the substrate beyond the depth of recessed silicon dioxide regions 45.

Figure 4H:
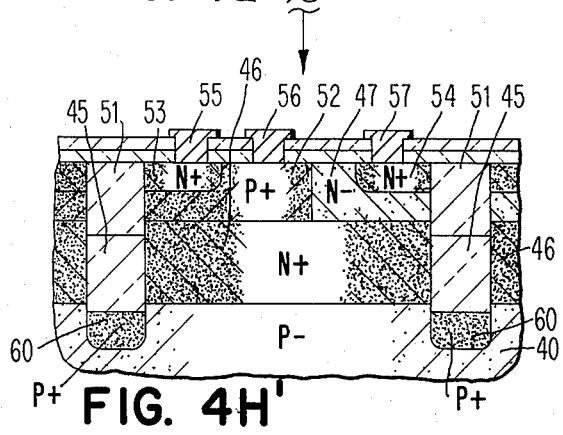
Figure 4E:
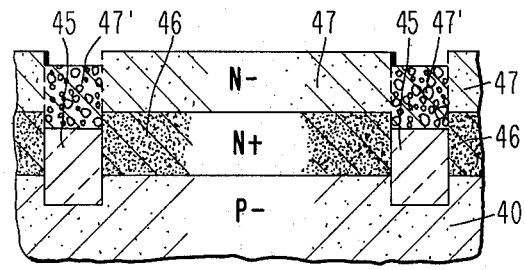
Figure 4G:
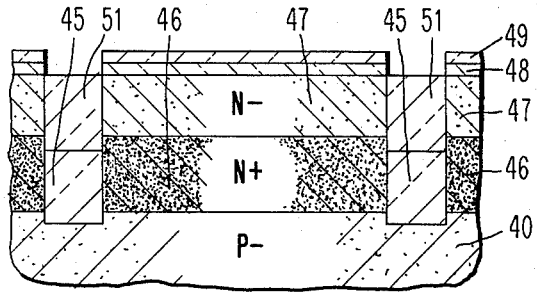

With reference now to FIG. 4E, there has been formed on substrate 40, an N epitaxial layer 47 having a maximum impurity concentration or doping level of $10^{18}$ atoms/cm$^3$ by conventional epitaxial techniques at a temperature in the order of from 950° - to 1150° C. During the deposition of epitaxial region 47, buried N+ subcollector regions 46 will out-diffuse partly up into the epitaxial layer and be driven partly down into substrate 40. It should also be noted that during the formation of epitaxial layer 47 the portions 47' directly above recessed silicon dioxide regions 45 would be polycrystalline silicon while the remainder of layer 47 will be monocrystalline silicon. The epitaxial layer has a thickness preferably in the order of from 1 – 4 microns, depending on the overall specifications of the integrated circuit. For purposes of the present invention, the thickness of the epitaxial layer is in the order of two microns.

Figure 4F:
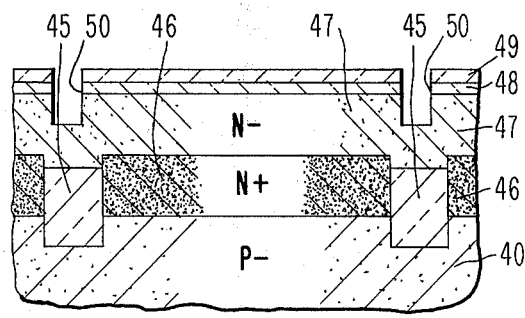
Figure 4H:
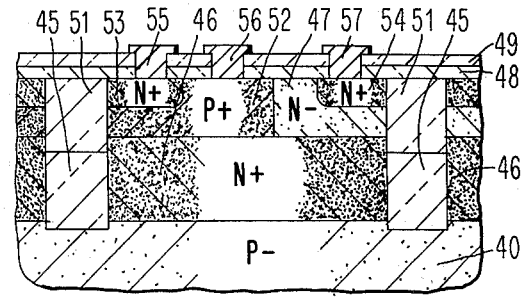

Next, as shown in FIG. 4F, the procedures of FIGS. 4A and 4B are now repeated with respect to the epitaxial layer to form a composite mask of silicon dioxide layer 48 and silicon nitride layer 49 on the surface of epitaxial layer 47, and to etch recesses 50 into the epitaxial layer respectively coincident with now buried recessed silicon dioxide regions 45. As an expedient for accomplishing this, the same masks used in the photolithographic formation of layers 41 and 42 as well as openings 44 with respect to substrate 40 may now be utilized with respect to epitaxial layer 47 to form recessed regions 50.

Then, following the same thermal oxidation step described with respect to FIG. 4C, recessed silicon dioxide regions 51 are formed extending through epitaxial layer 47 into registered contact with buried recessed silicon dioxide regions 45 to provide in effect a continuous region of dielectric isolation extending from the surface of epitaxial layer 47 down into substrate 40 beyond the depth to which buried subcollector regions 46 have diffused to thus provide complete lateral dielectric isolation including dielectric isolation for subcollector 46.

The processing of the bipolar integrated circuit is then completed to produce the structure shown in FIG. 4H by conventional integrated circuit fabrication techniques, e.g., those described in U.S. Pat. No. 3,539,876. In the final structure of FIG. 4H, P-type base region 52 abuts subcollector 46 and N+ emitter region 53 is enclosed within base region 52. A collector contact 54 provides a path for contacting subcollector 46. Metallic contacts 55, 56 and 57 are respectively made to emitter, base and collector.

It should be noted that even with a structure where N+ subcollector 46 does not extend beyond the depth of recessed silicon dioxide regions 45, so that direct shorting of adjacent subcollectors is not a problem, in the case of a lightly doped P— substrate, there remains a possibility that an inversion effect may occur along the bottom surface of silicon dioxide insets 45 to short to adjacent N+ subcollectors 46. In order to protect against this possibility, the P+ guard ring may be provided for as follows. After the recesses 44 are etched in silicon substrate 40 as shown in FIG. 4B, P+ regions 60 are formed beneath recesses 44 by any conventional limited introduction of impurities, FIG. 4B'. Then, the processing is continued in the manner previously described so that ultimately the structure shown in FIG. 4H' is produced which is identical to the structure of FIG. 4H except for P+ regions 60 in the substrate which serve as guard rings to prevent the inversion along the bottom surface of recessed silicon dioxide regions 45.

While the invention has been particularly shown and described with reference to the preferred embodiments thereof, it will be understood by those skilled in the art that various changes in form and details may be made therein without departing from the spirit and scope of the invention.

What is claimed is:

1. In the fabrication of integrated circuits, a method for forming dielectrically isolated regions in a silicon substrate comprising forming over a silicon substrate surface of one-type conductivity a first mask comprising silicon nitride having a plurality of openings therethrough, etching to recess the silicon substrate exposed in said plurality of openings, thermally oxidizing the recessed portions of the silicon substrate to form regions of recessed silicon dioxide extending into the substrate, removing said mask to expose the silicon substrate, carrying out a blanket introduction of impurities of opposite-type conductivity into the portions of the substrate surface remaining unoxidized to form regions which do not extend from the surface of said substrate to a substrate depth beyond that of the regions of recessed silicon dioxide, epitaxially depositing a layer of silicon of said opposite-type conductivity on said substrate surface, forming over said epitaxial layer a second mask comprising silicon nitride having a plurality of openings therethrough, in registration with said plurality of openings in said first mask, etching to recess the silicon epitaxial layer exposed in said plurality of openings in said second mask, and thermally oxidizing the recessed portions of said epitaxial layer to an extent sufficient to form regions of recessed silicon dioxide extending through said epitaxial layer into registered contact respectively with said regions of recessed silicon dioxide formed in the substrate.

2. The method of claim 1 wherein said silicon nitride masks are composites which respectively comprise a lower layer of silicon dioxide in contact with said surface, and an upper layer of silicon nitride on said lower layer.

3. The method of claim 1 wherein said substrate is of a P—type conductivity with a maximum of conductivity-determining impurity concentration of $1 \times 10^{17}$ atoms/cm$^3$, and the blanket introduced impurities are N—type and form N—type regions having a $C_0$ of at least $1 \times 10^{19}$ atoms/cm$^3$.

4. The method of claim 3 wherein said blanket introduction of impurities is carried out by ion implantation.

5. The method of claim 3 wherein said blanket introduction of impurities is carried out by diffusion.

6. The method of claim 3 including the additional step of introducing P—type impurities into the etched recesses in the silicon substrate prior to thermal oxidation.

* * * * *